United States Patent
Nakao et al.

(10) Patent No.: US 6,865,786 B2
(45) Date of Patent: Mar. 15, 2005

(54) METHOD FOR MANUFACTURING A SURFACE ACOUSTIC WAVE DEVICE USING A SHEAR HORIZONTAL TYPE SURFACE ACOUSTIC WAVE

(75) Inventors: Takeshi Nakao, Nagaokakyo (JP); Koji Fujimoto, Otsu (JP); Michio Kadota, Kyoto (JP); Toshimaro Yoneda, Ishikawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/614,412

(22) Filed: Jul. 7, 2003

(65) Prior Publication Data

US 2004/0093705 A1 May 20, 2004

Related U.S. Application Data

(62) Division of application No. 09/964,831, filed on Sep. 27, 2001, now Pat. No. 6,617,752.

(30) Foreign Application Priority Data

Oct. 27, 2000 (JP) ........................................ 2000-329341

(51) Int. Cl.[7] ................................................ H04R 17/00
(52) U.S. Cl. .......................... 29/25.35; 29/830; 29/831; 29/827
(58) Field of Search ................................ 29/25.35, 830, 29/831, 827; 310/333, 194; 216/75, 100; 381/160

(56) References Cited

U.S. PATENT DOCUMENTS 4,654,118 A * 3/1987 Staples ........................ 216/13

| 5,302,877 A | | 4/1994 | Sato et al. |
| 5,418,866 A | | 5/1995 | Chu |
| 5,432,392 A | | 7/1995 | Kadota et al. |
| 5,847,486 A | * | 12/1998 | Kadota et al. .......... 310/313 R |
| 5,850,167 A | * | 12/1998 | Abe ........................... 333/194 |
| 5,953,433 A | * | 9/1999 | Fujimoto et al. ........... 381/337 |
| 5,999,068 A | | 12/1999 | Tsutsumi et al. |
| 6,088,462 A | * | 7/2000 | Fujimoto et al. ........... 381/160 |
| 6,366,002 B1 | | 4/2002 | Kadata |
| 6,437,668 B1 | | 8/2002 | Nakao et al. |

FOREIGN PATENT DOCUMENTS

| CN | 1237036 A | 12/1999 |
| DE | 44 00 980 C2 | 7/1994 |
| EP | 0 860 943 A2 | 8/1998 |
| EP | 1 061 646 A1 | 12/2000 |
| JP | 10-233645 A | 9/1998 |
| JP | 11-298290 A | 10/1999 |

* cited by examiner

Primary Examiner—Carl J. Arbes
Assistant Examiner—Tai Nguyen
(74) Attorney, Agent, or Firm—Keating & Bennett, LLP

(57) ABSTRACT

In a method of manufacturing a surface acoustic wave device using a Shear Horizontal type surface acoustic wave, at least one interdigital transducer (IDT) is made of a material having a larger mass-load effect than that of aluminum. The metallization ratio of the IDT and the normalization film thickness $h/\lambda$ of the IDT are controlled such that ripple caused by a transversal mode wave is about 1.5 dB or less, where "h" indicates the film thickness of the electrodes and "h" indicates the wavelength of a surface acoustic wave.

5 Claims, 12 Drawing Sheets

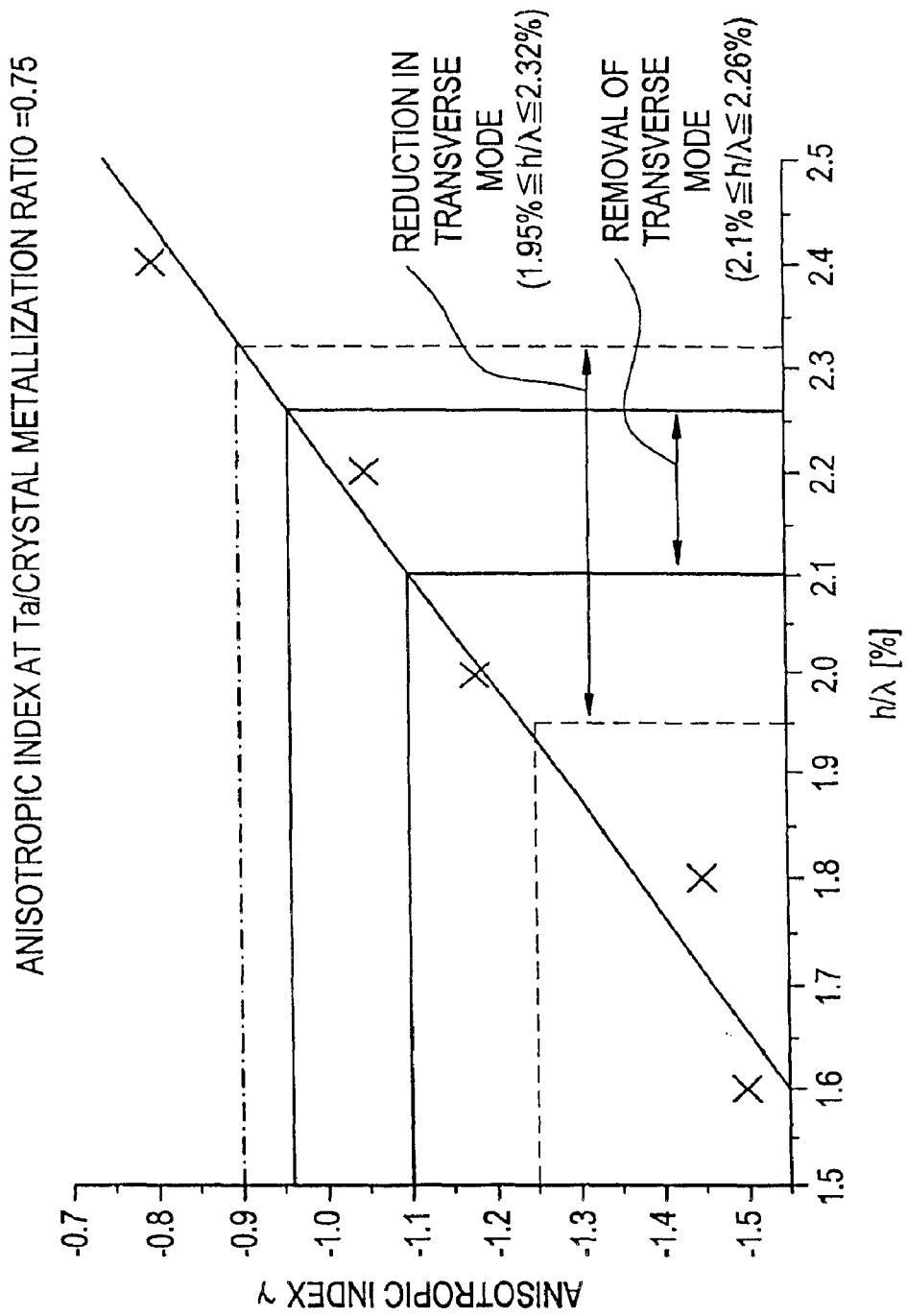

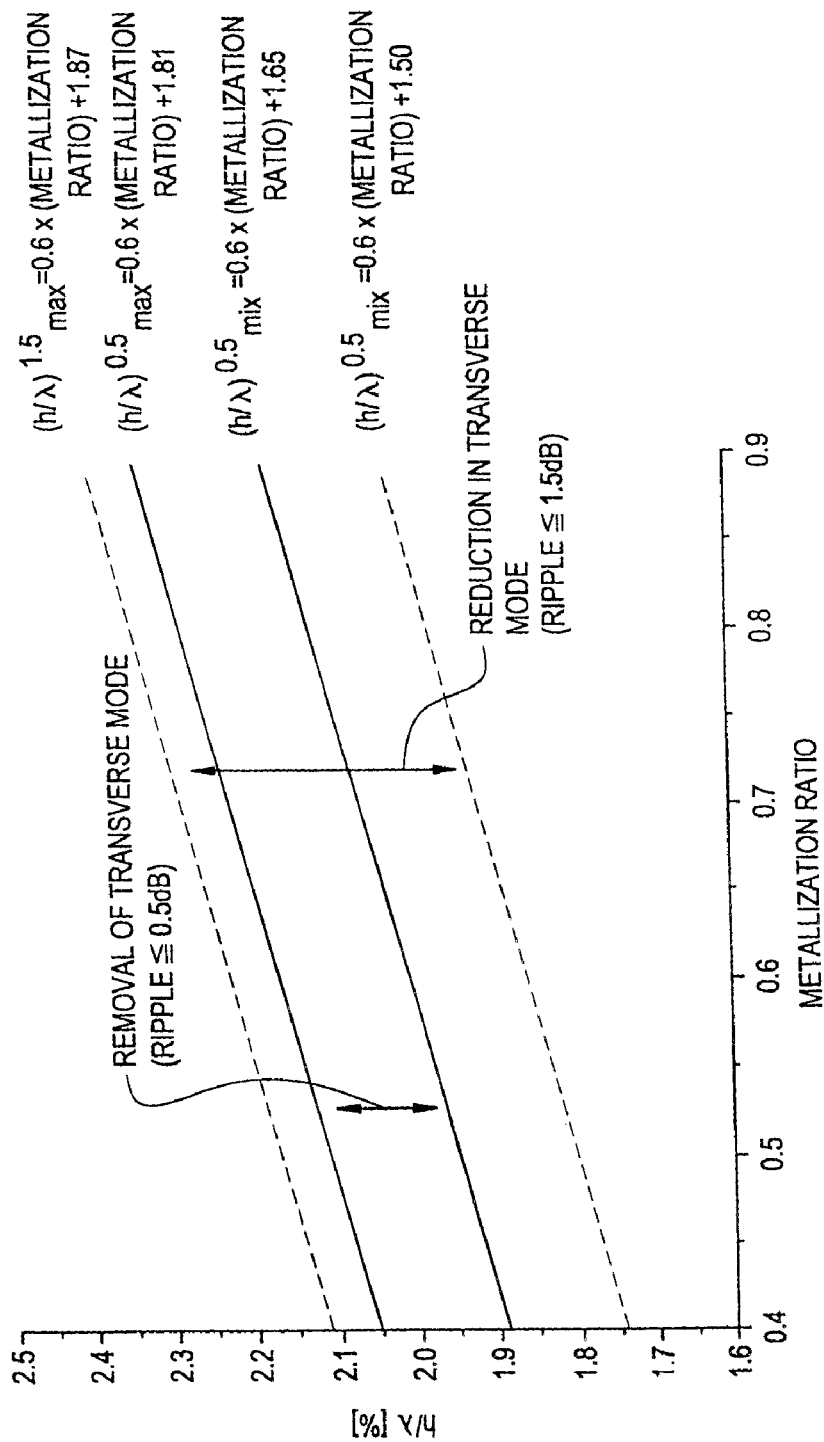

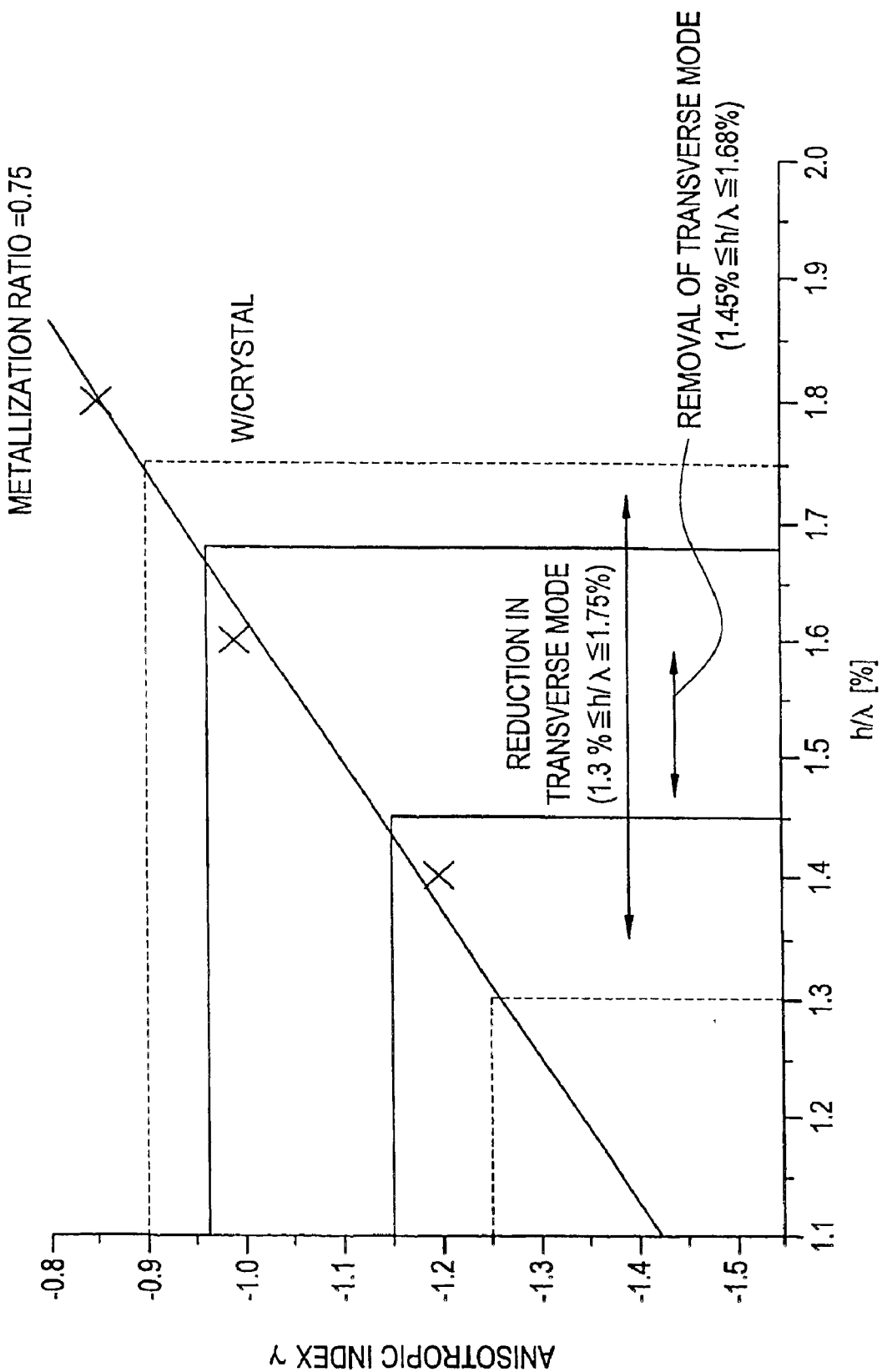

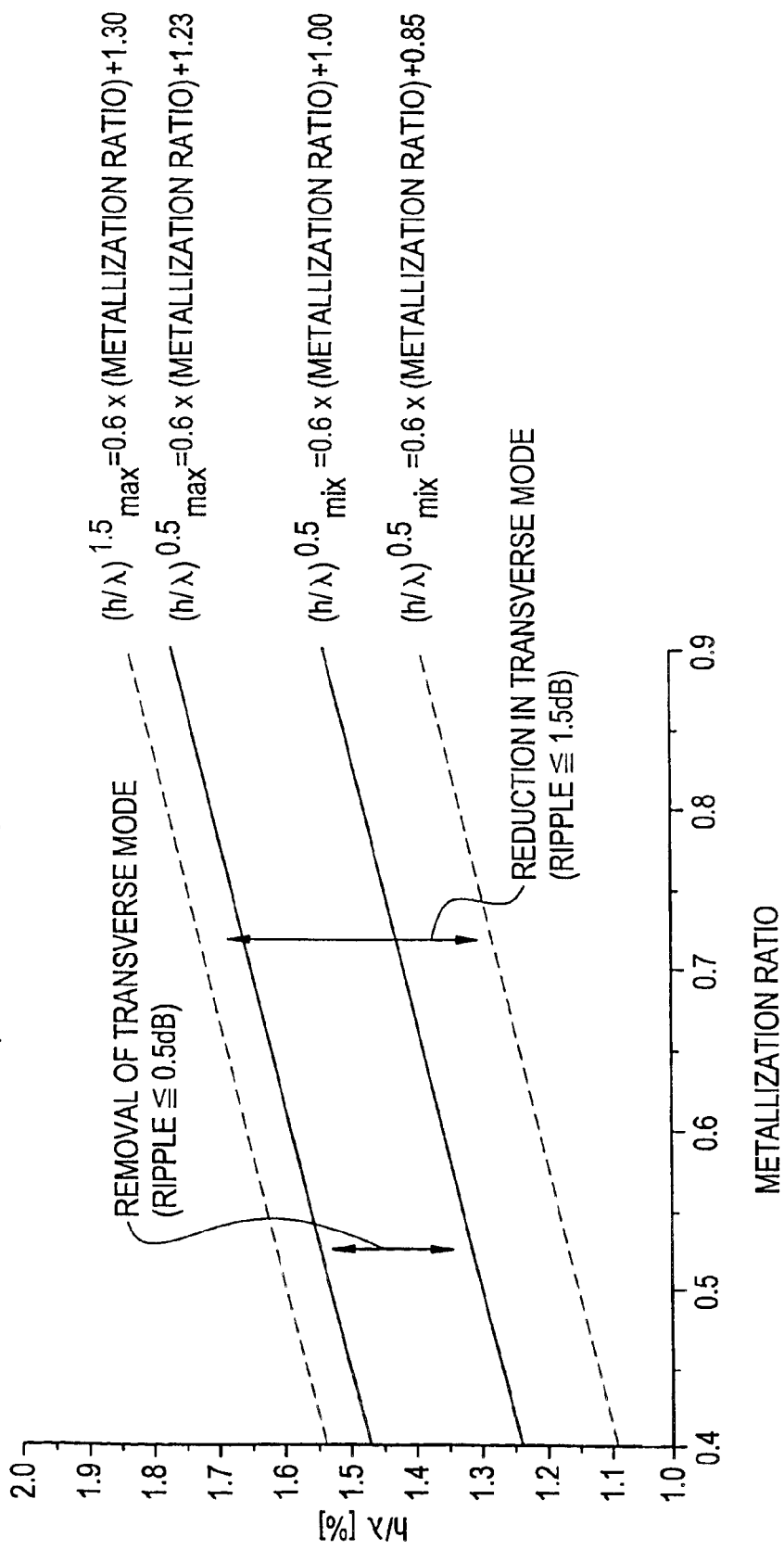

METALLIZATION RATIO = 0.75   h/λ2. 50%

METHOD FOR MANUFACTURING A SURFACE ACOUSTIC WAVE DEVICE USING A SHEAR HORIZONTAL TYPE SURFACE ACOUSTIC WAVE

This application is a Div of Ser. No. 09/964,831 filed 9/27/01 U.S. Pat. No. 6,617,752

BACKGROUND OF THE INVENTION

1. Field of the Invention

The present invention relates to surface acoustic wave devices, such as surface acoustic wave resonators and surface acoustic wave filters, and manufacturing methods therefor, and more particularly, to a surface acoustic wave device using a Shear Horizontal type ("SH-type") surface acoustic wave and having a structure for reducing a transversal mode spurious ripple, and a manufacturing method therefor.

2. Description of the Related Art

In surface acoustic wave devices, aluminum or alloys including aluminum as a main component have conventionally been widely used as the electrode material of an interdigital transducer (IDT). At least one IDT is disposed on a piezoelectric substrate and reflectors or reflective end surfaces are disposed at both sides of the area where the IDT is located so as to define a resonator or a longitudinally coupled resonator filter.

In such a surface acoustic wave device, it may be possible that the IDT functions as a waveguide to generate a transversal mode wave, and ripples caused by the transversal mode wave are generated in a pass band. To reduce the ripples caused by the transversal mode wave, various methods have been attempted. Those methods include a method for reducing the intersection width of IDTs and a weighting method.

A surface acoustic wave device has also been proposed in Japanese Unexamined Patent Application Publication No. Hei-11-298290, in which a quartz substrate is used, an IDT made from a metal or an alloy having tantalum (Ta), which has a larger mass than aluminum (Al), as a main component is disposed on the quartz substrate, and an SH-type surface acoustic wave is used. Since the IDT is made from a metal or an alloy having tantalum, which has a large mass, as a main component, the number of the pairs of the electrode fingers of the IDT is as small as 10 to 20, and thereby the surface acoustic wave device is made compact.

When an electrode material having a large mass-load effect, such as a material having Ta as a main component, is used, the sonic speed obtained at the area where an IDT is located becomes much lower than the sonic speed obtained around the area. Therefore, a waveguide effect is very large at the IDT portion.

Consequently, when a longitudinally coupled resonator filter is produced, ripples caused by a transversal mode wave become complicated and very large, as indicated by arrows X in FIG. 13.

As described above, as methods for removing ripples caused by a transversal mode wave from the pass band of a filter or from the vicinity of a resonant point of a resonator, a method A in which an intersection width is made small and the frequency distance between a basic-mode wave and a transversal mode wave is made large, and a method B in which the intersection width of an IDT is weighted with a $\cos^2$ function to eliminate the transversal mode wave have been conventionally attempted.

In the method A, it is necessary to set the intersection width to $10\lambda$ or less, where $\lambda$ is the wavelength of a surface acoustic wave. When a quartz substrate and an IDT having 10 to 20 pairs of electrode fingers are used to provide a surface acoustic wave device, the input and output impedance exceeds 2 k$\Omega$ and is very high, so that the surface acoustic wave device cannot be used for actual products. Therefore, it is necessary to increase the number of the pairs of electrode fingers to reduce the impedance.

More specifically, whereas the surface acoustic wave device disclosed in the above-described publication uses tantalum, which has a large mass, as a main component to form electrodes and allows the number of pairs in IDTs to be reduced, when the method for reducing the intersection width is used, the number of the pairs of electrode fingers needs to be increased to reduce the input and output impedance. Therefore, the surface acoustic wave device cannot be made compact.

In the method B, weighting itself increases a loss of the surface acoustic wave device. In addition, since weighting reduces the area of an intersection-width portion, the impedance of the surface acoustic wave device becomes very high in the same way as in the method A. Therefore, to reduce the impedance, the intersection width needs to be twice as large as the required length. As a result, the surface acoustic wave device cannot be made compact.

In other words, when either the method A or the method B is used, if ripples caused by a transversal mode wave are to be reduced, the advantage of the surface acoustic wave device in reducing the size of the device as disclosed in the above-described publication is prevented from being achieved.

SUMMARY OF THE INVENTION

In order to overcome the problems described above, preferred embodiments of the present invention provide a surface acoustic wave device which has electrodes made from a material having a larger mass-load effect than aluminum, which is made to be very compact, which has a structure that minimizes and eliminates ripples caused by a transversal mode wave, and which uses an SH-type surface acoustic wave, and a manufacturing method therefor.

According to a preferred embodiment of the present invention, a surface acoustic wave device using an SH-type surface acoustic wave includes a quartz substrate, and at least one interdigital transducer disposed on the quartz substrate and made from electrodes having a larger mass-load effect than that of aluminum, wherein the metallization ratio "d" and the normalized film thickness h/$\lambda$ of the interdigital transducer are within a range such that a ripple caused by a transversal mode wave is about 0.5 dB or less, where "$\lambda$" is the wavelength of the surface acoustic wave and "h" indicates the film thickness of the electrodes of the at least one interdigital transducer.

In the surface acoustic wave device, the metallization ratio "d" and the normalized film thickness h/$\lambda$ of the interdigital transducer are preferably controlled so as to be within specific ranges such that the ripple caused by the transversal mode wave is about 0.5 dB or less. Therefore, even in a case in which an IDT made of electrodes having a larger mass-load effect than that of aluminum is used, and the number of the pairs of electrode fingers is reduced to make the device very compact, the ripple caused by the transversal mode wave is effectively suppressed and eliminated. Consequently, a compact surface acoustic wave device using an SH-type surface acoustic wave and having excellent frequency characteristics is provided.

In the surface acoustic wave device, the interdigital transducer may include at least one electrode layer made from a metal having a larger mass than that of aluminum.

In the surface acoustic wave device, the interdigital transducer may be made from a single metal having a larger mass than that of aluminum.

The above-described advantages are also achieved in another preferred embodiment of the present invention which provides a surface acoustic wave device using an SH-type surface acoustic wave, including a quartz substrate, and at least one interdigital transducer disposed on the quartz substrate and made from tantalum, wherein the normalized film thickness h/λ of the interdigital transducer is within a range from about 0.6d+1.65 to about 0.6d+1.81, where "d" indicates the metallization ratio of the interdigital transducer, "λ" indicates the wavelength of the surface acoustic wave, and "h" indicates the film thickness of the electrodes of the at least one interdigital transducer.

In the surface acoustic wave device according to this preferred embodiment, since at least one interdigital transducer made from tantalum is disposed on the quartz substrate, and the normalized film thickness h/λ of the interdigital transducer falls in a range from about 0.6d+1.65 to about 0.6d+1.81, where "d" indicates the metallization ratio, ripples caused by a transversal mode wave are effectively suppressed. Therefore, even in a case in which at least one IDT made from tantalum is formed, and the number of the pairs of the electrode fingers in the IDT is reduced to make the device very compact, the ripple caused by the transversal mode wave is effectively suppressed and eliminated. Consequently, a compact surface acoustic wave device using an SH-type surface acoustic wave and having excellent frequency characteristics is provided.

The above-described advantages are also achieved in still another preferred embodiment of the present invention that provides a surface acoustic wave device using an SH-type surface acoustic wave, including a quartz substrate, and at least one interdigital transducer disposed on the quartz substrate and made from tungsten, wherein the normalized film thickness h/λ of the interdigital transducer is within a range from about 0.6d+0.85 to about 0.6d+1.30, where "d" indicates the metallization ratio of the interdigital transducer, "λ" indicates the wavelength of the surface acoustic wave, and "h" indicates the film thickness of the electrodes of the interdigital transducer.

In the surface acoustic wave device, since at least one interdigital transducer made from tungsten is disposed on the quartz substrate, and the normalized film thickness h/λ of the interdigital transducer is within a range from about 0.6d+0.85 to about 0.6d+1.30, ripples caused by a transversal mode wave are minimized and eliminated even in a case in which the number of the pairs of the electrode fingers in the IDT is reduced to make the device very compact. Consequently, a compact surface acoustic wave device using an SH-type surface acoustic wave and having excellent frequency characteristics is provided.

According to the surface acoustic wave device having the above-described unique structure, the transversal mode ripple is minimized to about 1.5 dB or less.

In the surface acoustic wave device according to various preferred embodiments of the present invention, the normalized film thickness h/λ may fall in a range from about 0.6d+1.00 to about 0.6d+1.23. In this case, the transversal mode ripple is suppressed to about 0.5 dB or less.

In the surface acoustic wave devices described above, a plurality of the interdigital transducers may be provided to constitute a longitudinally coupled resonator filter. In this case, a compact longitudinally coupled resonator filter having excellent frequency characteristics is provided. In the surface acoustic wave devices described above, longitudinally coupled resonator filters may be connected in a cascade arrangement in at least two stages.

In the surface acoustic wave devices described above, the interdigital transducer may be disposed on the quartz substrate to constitute a one-port surface acoustic wave resonator. In this case, a compact one-port surface acoustic wave resonator having excellent frequency characteristics is provided.

The surface acoustic wave devices described above may be configured such that a plurality of the interdigital transducers is disposed on the quartz substrate, wherein each of the interdigital transducers constitutes a one-port surface acoustic wave resonator, and the plurality of the interdigital transducers are connected to constitute a ladder-type filter on the quartz substrate.

The surface acoustic wave devices described above may also be configured such that a plurality of the interdigital transducers are disposed on the quartz substrate, wherein each of the interdigital transducers constitutes a one-port surface acoustic wave resonator, and the plurality of the interdigital transducers are connected to constitute a lattice-type filter on the quartz substrate.

In the above two cases, compact ladder-type and lattice-type filters having excellent frequency characteristics are provided.

The surface acoustic wave devices described above are widely used for surface-acoustic resonators and surface acoustic wave filters. The foregoing advantages may also be achieved through the provision of a communication device using one of the surface acoustic wave devices according to preferred embodiments of the present invention described above.

The above-described advantages are achieved in yet another preferred embodiment of the present invention through the provision of a manufacturing method for a surface acoustic wave device using an SH-type surface acoustic wave, including the steps of preparing a quartz substrate, forming a metal film having a larger mass-load effect than that of aluminum on the quartz substrate, and patterning the metal film by reactive ion etching or by a lift-off process such that the metallization ratio "d" and the normalized film thickness h/λ of the interdigital transducer, which reduce a spurious transversal mode ripple to about 1.5 dB or less are satisfied, to form at least one interdigital transducer, where "d" indicates the metallization ratio of the interdigital transducer, "λ" indicates the wavelength of a surface acoustic wave, and "h" indicates the film thickness of the interdigital transducer.

In the manufacturing method for a surface acoustic wave device using an SH-type surface acoustic wave according to a preferred embodiment of the present invention, a metal film having a larger mass-load effect than aluminum is disposed on the quartz substrate, and patterning is applied to the metal film by reactive ion etching or by a lift-off process such that the metallization ratio "d" and the normalized film thickness h/λ which decrease a transversal mode ripple to about 1.0 dB or less are satisfied, to form at least one interdigital transducer. Therefore, even when the pair of the electrode fingers is reduced to make the device compact, the transversal mode ripple is suppressed in the device. In addition, since patterning is performed by the reactive ion etching or the lift-off process, an IDT satisfying the foregoing normalized film thickness h/λ is always formed.

The manufacturing method for a surface acoustic wave device using an SH-type surface acoustic wave, according to a preferred embodiment described above, may be configured such that the metal film is made from tantalum, and patterning is performed by the reactive ion etching or by the lift-off process such that the normalized film thickness h/λ is within a range from about 0.6d+1.50 to about 0.65d+1.87, preferably in a range from about 0.6d+1.65 to about 0.6d+1.81, to form at least one interdigital transducer.

The manufacturing method for a surface acoustic wave device using an SH-type surface acoustic wave according to the preferred embodiment described above may be configured such that the metal film is made from tungsten, and patterning is performed by the reactive ion etching or by the lift-off process such that the normalized film thickness h/λ falls in a range from about 0.6d+0.85 to about 0.6d+1.30, preferably in a range from about 0.6d+1.00 to about 0.6d+1.23, to form at least one interdigital transducer.

Other features, elements, characteristics and advantages of the present invention will become more apparent from the detailed description of preferred embodiments below with reference to the attached drawings.

BRIEF DESCRIPTION OF THE DRAWINGS

FIG. 4 shows the relationship between a normalized film thickness h/λ and an anisotropic index obtained in a structure in which an interdigital transducer (IDT) made from tantalum (Ta) is disposed on a quartz substrate.

FIG. 5 shows a range in which ripples caused by a transversal mode wave are eliminated according to preferred embodiments of the present invention, and shows the relationship between the metallization ratio and the normalized film thickness h/λ.

FIG. 7 shows the relationship between a normalized film thickness h/λ and an anisotropic index obtained in a structure in which an IDT made from tungsten (W) is disposed on a quartz substrate.

FIG. 8 shows a range in which ripples caused by a transversal mode wave are eliminated according to preferred embodiments of the present invention, and shows the relationship between the metallization ratio and the normalized film thickness h/λ.

DETAILED DESCRIPTION OF PREFERRED EMBODIMENTS

Figure 1:
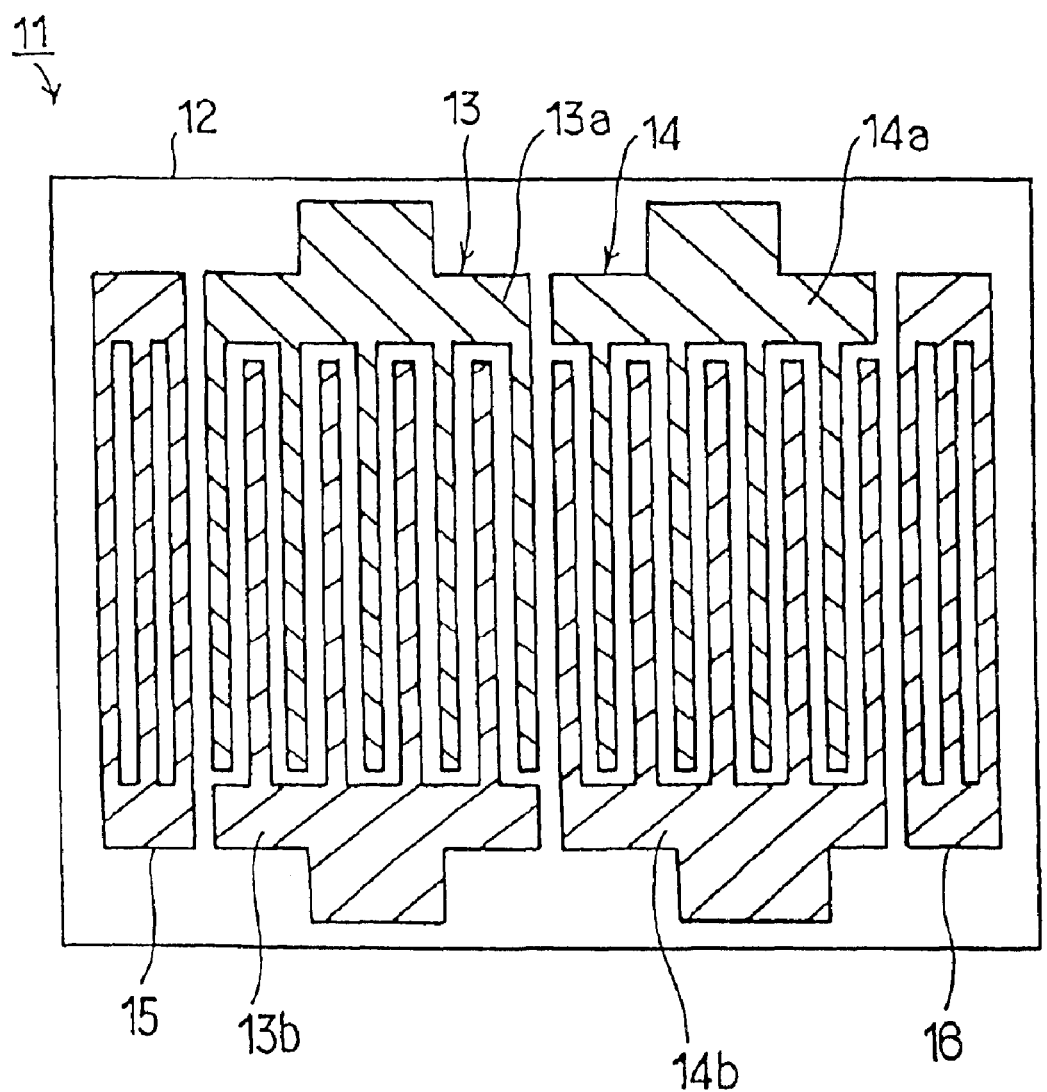
FIG. 1 is an outline plan view showing a surface acoustic wave device according to a preferred embodiment of the present invention.

Preferred embodiments of the present invention will be described below by referring to the drawings.

FIG. 1 is an outline plan view of a longitudinally coupled resonator-type filter defining as a surface acoustic wave device according to a first preferred embodiment of the present invention.

A longitudinally coupled resonator-type filter 11 preferably includes a substantially rectangular plate-shaped quartz substrate 12. Interdigital transducers (IDTs) 13 and 14 are disposed on the quartz substrate 12. The IDT 13 has a pair of comb electrodes 13a and 13b, the IDT 14 has a pair of comb electrodes 14a and 14b, and the electrode fingers of the pair of comb electrodes are disposed alternately. The electrode fingers of the comb electrodes 13a, 13b, 14a, and 14b extend in a direction that is substantially perpendicular to a surface acoustic wave propagation direction.

Therefore, the IDTs 13 and 14 are disposed in the surface acoustic wave propagation direction. At both sides of the portion where the IDTs 13 and 14 are provided, in the surface acoustic wave propagation direction, grating reflectors 15 and 16 are preferably disposed. The reflectors 15 and 16 have a structure in which a plurality of electrode fingers are short-circuited at both ends, and the electrode fingers of the reflectors 15 and 16 extend in the direction that is substantially perpendicular to the surface acoustic wave propagation direction.

In the longitudinally coupled resonator-type surface acoustic wave filter 11, the IDTs 13 and 14 and the reflectors 15 and 16 are preferably made from tantalum (Ta), which is an electrode material having a larger mass than that of aluminum (Al). In the IDTs 13 and 14, the film thickness h/λ of the IDTs 13 and 14, normalized by the wavelength of the surface acoustic wave is preferably about 0.6d+1.65 to about 0.6d+1.81, where "d" indicates metallization ratio, "h" indicates the film thickness of an electrode, and "λ" indicates the wavelength of the surface acoustic wave.

The metallization ratio "d" refers to the ratio of the width of an electrode finger to the sum of the width of the gap between electrode fingers in the surface acoustic wave propagation direction and the width of the electrode finger in the surface acoustic wave propagation direction.

In the present preferred embodiment, since the IDTs 13 and 14 are made from Ta, which has a large mass, the number of the pairs of the electrode fingers of the IDTs 13 and 14 can be made small, such as about 19 or less, and thereby the device is made very compact.

The inventors of the present invention discovered that even when the IDTs 13 and 14 are made from a large-mass electrode material having Ta and the number of the pairs of the electrode fingers of the IDTs are made small, if the normalized film thickness h/λ and the metallization ratio are within the foregoing ranges, ripples caused by a transversal mode wave are effectively minimized and eliminated to achieve the advantages of preferred embodiments of the present invention.

Specific experimental examples of preferred embodiments will be used to describe the present invention.

Figure 2A:
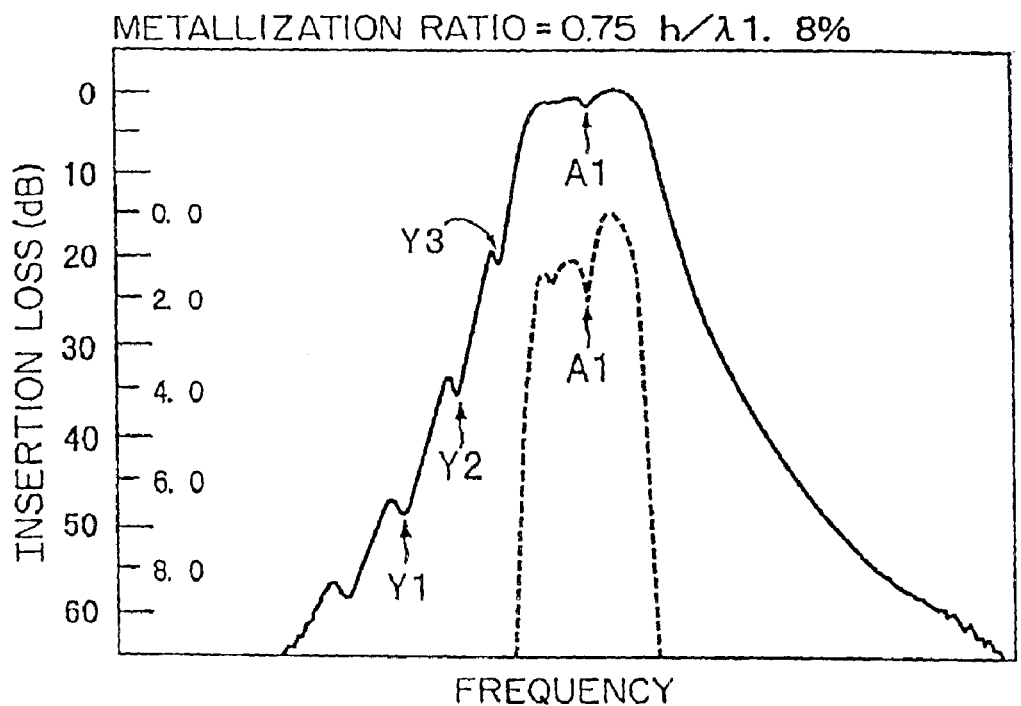
FIG. 2A and FIG. 2B show the attenuation-frequency characteristics of a surface acoustic wave device, obtained when a metallization ratio "d" is about 0.75 and a normalized film thickness h/λ is about 1.8% and about 2.0%, respectively.
Figure 2B:
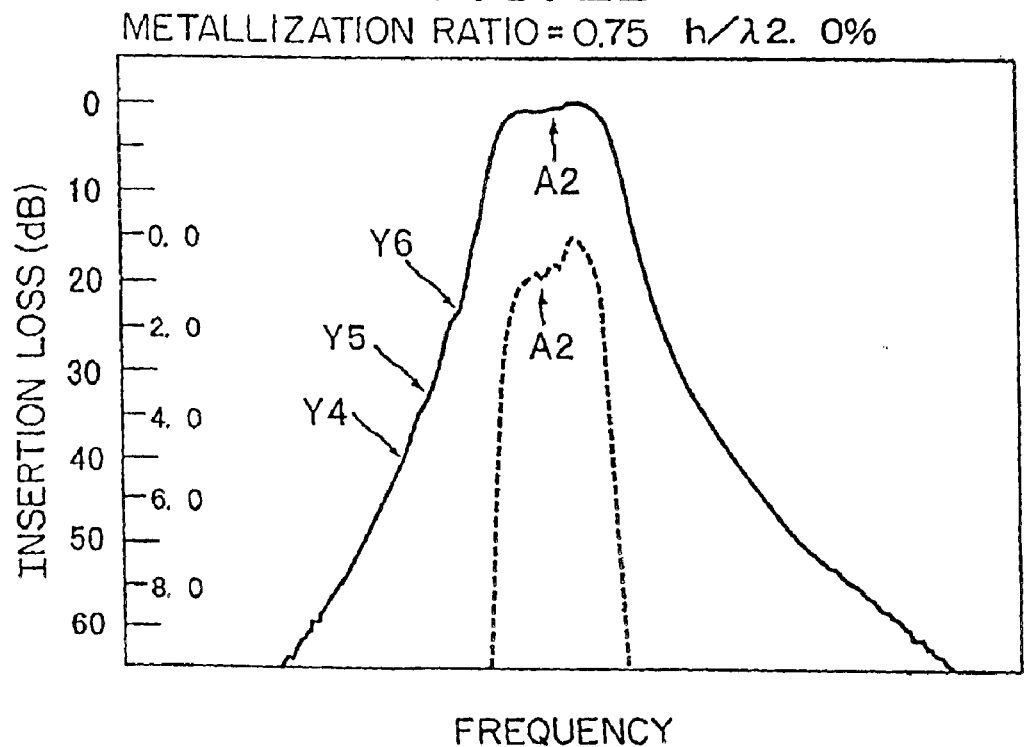
Figure 3A:
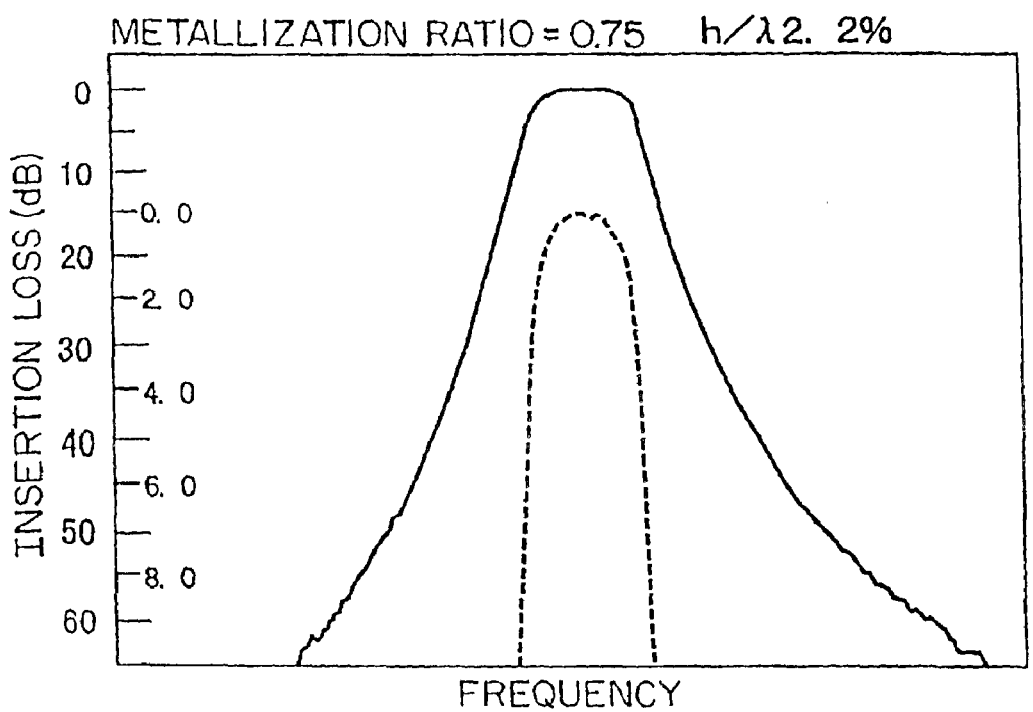
FIG. 3A and FIG. 3B show the attenuation-frequency characteristics of a surface acoustic wave device, obtained when the metallization ratio "d" is about 0.75 and the normalized film thickness h/λ is about 2.2% and about 2.4%, respectively.
Figure 3B:
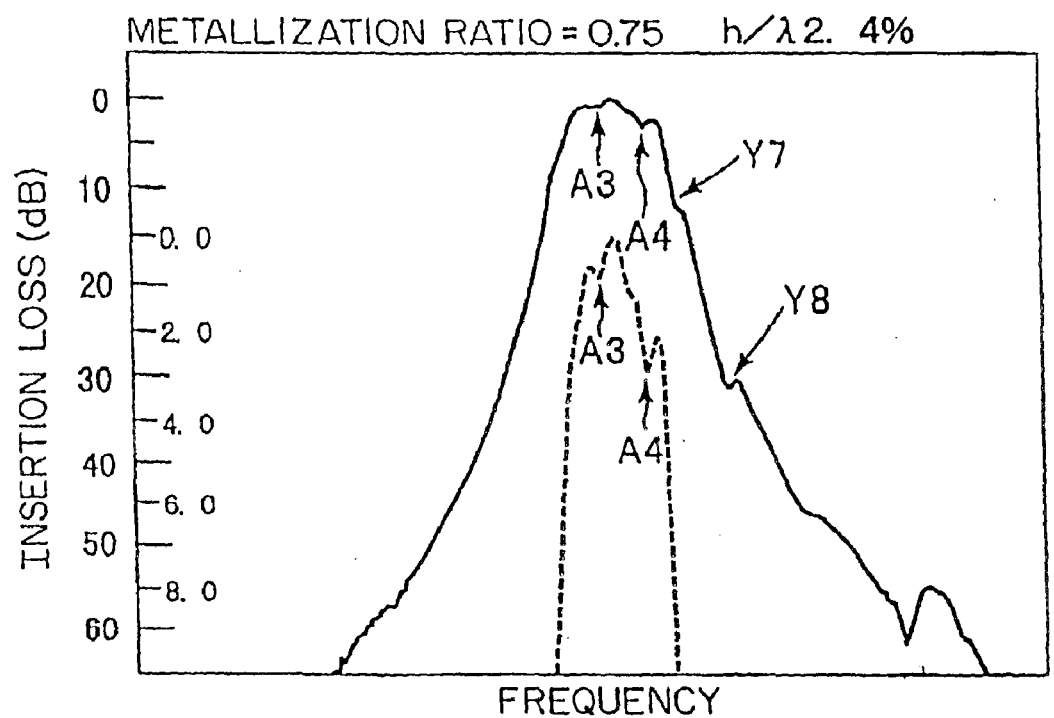

A quartz substrate having a quartz orientation indicated by Euler angles (0°, 127°, 90°) was used as the quartz substrate 12, and the IDTs 13 and 14 and the reflectors 15 and 16 were formed by using Ta as an electrode material on the quartz substrate 12. The number of the pairs of the electrode fingers of the IDTs 13 and 14 was set to 13, and the number of the electrode fingers of the reflectors 15 and 16 was set to 10. Various longitudinally coupled resonator-type surface acoustic wave filters 11 using an SH wave were made so as to have different normalized film thickness h/λ in a range from about 0.017 to about 0.025 while the metallization ratio "d" of the IDTs 13 and 14 was set within a range of about 0.5 to about 0.90. FIG. 2 and FIG. 3 show the attenuation-frequency characteristic of some of the surface acoustic wave devices made as described above. FIG. 2A shows a characteristic obtained when the metallization ratio "d" was about 0.75 and h/λ was about 0.018. FIG. 2B shows a characteristic obtained when the metallization ratio "d" was about 0.75 and h/λ was about 0.02. FIG. 3A shows a characteristic obtained when the metallization ratio "d" was about 0.75 and h/λ was about 0.022. FIG. 3B shows a characteristic obtained when the metallization ratio "d" was about 0.75 and h/λ was about 0.024.

In FIG. 2A to FIG. 3B, dotted lines indicate characteristics with an expanded attenuation scale shown in the vertical axis at the right.

In the characteristic shown in FIG. 2A, it is seen that a ripple indicated by an arrow A1 was generated at the center of a pass band, and a number Y1 to Y3 of ripples appeared at the lower-frequency side of the pass band. Also in the characteristic shown in FIG. 2B, it is seen that large ripples appeared in the pass band as indicated by an arrow A2, and ripples were generated at the lower-frequency side of the pass band as indicated by arrows Y4 to Y6.

In the characteristic shown in FIG. 3B, it is seen that large ripples indicated by arrows A3 and A4 were generated in the pass band, and ripples Y7 and Y8 appeared at the higher-frequency side of the pass band.

In contrast, in the characteristic shown in FIG. 3A, very small, negligible ripples appeared in the pass band, and very small ripples appeared in the vicinity of the pass band even in the lower-frequency side and the higher-frequency side of the pass band.

Therefore, even when the metallization ratio "d" and the normalized film thickness h/λ are adjusted to reduce the number of the pairs of electrode fingers to make the device compact, ripples caused by a transversal mode wave is still effectively minimized.

In other words, preferred embodiments of the present invention provide advantages in that even when IDTs are made of a metallic material, such as tantalum, having a larger mass than that of aluminum in order to reduce the number of electrode fingers to make the device compact, the metallization ratio "d" and the normalized film thickness h/λ of the IDTs are selected so as to minimize ripples caused by a transversal mode wave.

As described above, when IDTs are made of a metal having a large mass, the sonic speed obtained in the IDTs 13 and 14 becomes much slower than that obtained around them, and a waveguide effect becomes strong. Therefore, as described with the surface acoustic wave device disclosed in the foregoing publication, ripples caused by a transversal mode wave become large. It is clear from FIG. 2A to FIG. 3B, however, that ripples caused by a transversal mode wave does occur only to a very small degree at a film thickness "h" falling in the specific desired range. When the actual film thickness is thinner than a film thickness within the specific desired range, ripples caused by a transversal mode wave appear at the lower-frequency side of the pass band as shown in FIG. 2A and FIG. 2B. When the actual film thickness is thicker than a film thickness within the specific desired range, ripples caused by a transversal mode wave appear at the higher-frequency side of the pass band as shown in FIG. 3B.

In surface acoustic wave devices having IDTs made from a material having aluminum as a main component, the above-described phenomenon does not occur in which the frequency where ripples occur shifts from the lower-frequency side to the higher-frequency side according to the film thickness. When the IDTs 13 and 14 are made of a metallic material, such as tantalum, having a larger mass than that of aluminum, the above-described ripple-frequency-shift phenomenon occurs. The following cause thereof can be expected.

There is an analysis method using a waveguide model to calculate the frequency where a transversal mode wave is generated. According to this analysis method, the cause will be described below.

The direction that is substantially perpendicular to the electrode fingers of the IDTs 13 and 14 is set to a reference 0 (rad), and the sonic speed of a surface acoustic wave propagating in a direction shifted from the reference 0 by an angle θ (rad) is set to $V_{saw}(\theta)$. Then, $V_{saw}(\theta)$ is approximated in terms of θ by a quadratic function $V_{saw}(\theta)=V_0\{1+(\gamma/2)\theta^2\}$, where γ is called the anisotropic index of the sonic speed in a substrate and described in various documents. In an ST-cut quartz substrate, for example, γ is 0.378.

When the frequency where a transversal mode wave is generated is calculated by the waveguide model with γ being introduced, if γ is larger than −1, the transversal mode wave occurs at the higher-frequency side than the basic-mode wave. If γ is smaller than −1, the transversal mode wave occurs at the lower-frequency side than the basic-mode wave.

Therefore, in the ST-cut quartz substrate, the transversal mode wave occurs at the higher-frequency side than the basic-mode wave. It is actually known that the transversal mode occurs at the higher-frequency side than the basic mode in surface acoustic wave devices having electrodes made from aluminum and using a Rayleigh wave.

The anisotropic index γ of the sonic speed in a substrate needs to be obtained with the mass of electrodes being taken into consideration when electrodes are disposed on the substrate. Therefore, γx indicates the anisotropic index of the sonic speed, in which the mass of electrodes is taken into consideration, in the following description.

The inventors of the present invention discovered based on the above-described fact that the following can be considered. Specifically, when an electrode material having aluminum as a main component, which is widely used for currently available surface acoustic wave devices, is used, a slight change in γx caused by the effects of the film thickness of the electrodes and the metallization ratio occurs and γx does not shift largely from γ of the substrate itself. When an electrode material having a large mass, such as tantalum, is used, however, the mass-load effect of the electrodes, namely, the film thickness of the electrodes, changes γx greatly. It can be expected that when the film thickness of the electrodes is small, γx<−1 and the transversal mode wave is generated at the lower-frequency side of the pass band, and when the film thickness of the electrodes is large, γx gradually increases to be γx>−1 and the transversal mode wave is generated at the higher-frequency side of the pass band. It can also be expected that since it is difficult for the transversal mode wave to occur in the vicinity of γx=−1, which is between γx<−1 and γx>−1, ripples caused by the transversal mode wave can be reduced or can be completely removed as shown in FIG. 3A.

To prove the foregoing expectation, γx was estimated by the finite-element method. More specifically, the metallization ratio "d" was set to about 0.75, the normalized film thickness h/λ was changed, and the anisotropic index γx was observed. FIG. 4 shows the result.

It is clear from FIG. 4 that γx shifted from the area where γx<−1 to the area where γx>−1 at a boundary disposed in the vicinity of h/λ=2.2%.

With the foregoing experimental result being taken into consideration, a range where it is considered that the ripples caused by the transversal mode wave are substantially eliminated, that is, a range where the ripples are about 0.5 dB or less, was obtained. As a result, it was determined that when the metallization ratio was about 0.75, the normalized film thickness h/λ should be about 2.10% to about 2.25%, and γx should be about −1.10 to about −0.96.

The metallization ratio "d" was changed in the surface acoustic wave device 11 to have values, including the above-described value, the finite-element method was used in the same way, and areas where the ripple could be reduced to about 1.5 dB or less or about 0.5 dB or less were obtained. FIG. 5 shows the result.

It is clear from FIG. 5 that the normalized film thickness should be within a range of about 0.6d+1.50 to about 0.6d+1.87 to make the ripples in the band caused by the transversal mode wave to be about 1.5 dB or less, and to fall within a range of about 0.6d+1.65 to about 0.6d+1.81, both inclusive, to make the ripples in the band caused by the transversal mode wave to be about 0.5 dB or less. As described above, it is understood that the metallization ratio "d" and the normalized film thickness h/λ are adjusted in the longitudinally coupled resonator-type surface acoustic wave filter 11 to effectively suppress the ripples caused by the transversal mode wave without weighting the intersection width. In other words, the ripples caused by the transversal mode wave can be effectively minimized without preventing the longitudinally coupled resonator-type surface acoustic wave filter 11 from being made compact.

Figure 6A:
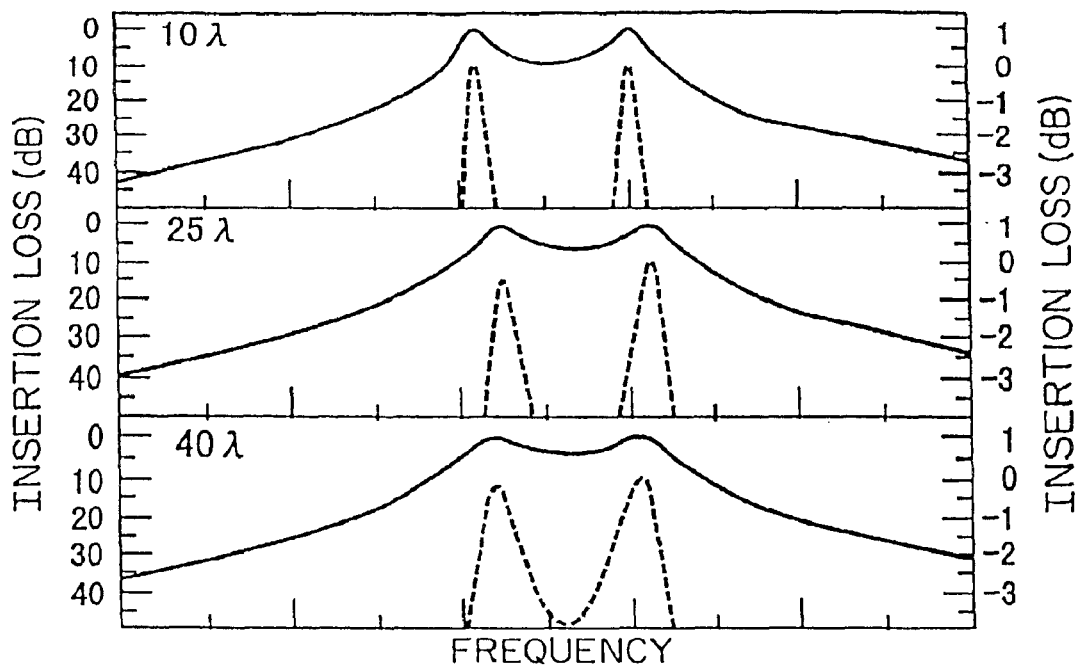
FIG. 6A shows attenuation-frequency characteristics obtained when the metallization ratio "d" is about 0.75, the normalized film thickness h/λ is about 2.15%, and the intersection width of electrode fingers is approximately 10λ, 25λ, and 40λ.
Figure 6B:
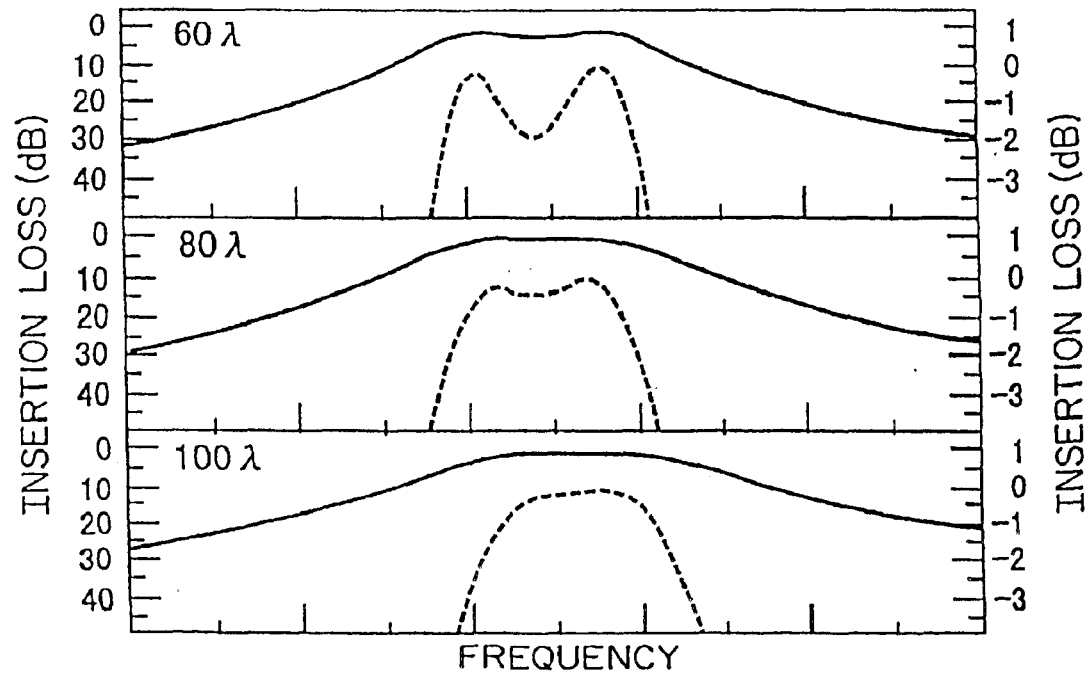
FIG. 6B shows attenuation-frequency characteristics obtained when the metallization ratio "d" is about 0.75, the normalized film thickness h/λ is about 2.15%, and the intersection width of electrode fingers is approximately 60λ, 85λ, and 100λ.

The inventors of the present invention also checked the degree of an effect caused by a change in the intersection width of the electrode fingers of the IDTs on the ripples caused by the transversal mode wave. FIG. 6A and FIG. 6B show attenuation-frequency characteristics obtained in the longitudinally coupled resonator-type surface acoustic wave filter 11 when the IDTs 13 and 14 were made of Ta, the metallization ratio "d" was set to about 0.75, and h/λ was set to about 2.15% in the same way as in the above-described experiment, and the intersection width of the electrode fingers was changed to approximate values of 10λ, 25λ, 40λ, 60λ, 80λ, and 100λ. In FIG. 6A and FIG. 6B, dotted lines indicate main portions of the attenuation-frequency characteristics with an expanded scale shown at the right.

It is clear from FIG. 6A and FIG. 6B that even when the intersection width was largely changed, the ripples caused by the transversal mode wave did not occur.

The IDTs were made from Ta in the experiments shown in FIG. 4 and FIG. 5. In the present invention, however, the electrode material used for the IDTs is not limited to Ta.

The inventors of the present invention also made the IDTs 13 and 14 with tungsten (W) instead of Ta, checked the change of the anisotropic index γx while the normalized film thickness was changed, and obtained the range of the normalized film thickness, where the ripples in the band can be reduced to about 1.5 dB or less or about 0.5 dB or less while the metallization ratio "d" was changed, in the same way as in the experiments shown in FIG. 4 and FIG. 5. FIG. 7 and FIG. 8 show the results.

It is clear from FIG. 7 that when the metallization ratio "d" was about 0.75, the normalized film thickness h/λ should be about 1.3% to about 1.75% to make the ripples be about 1.5 dB or less, and should be about 1.45% to about 1.68% to make the ripples be about 0.5 dB or less. It is clear from FIG. 8 that when the metallization ratio "d" was changed, the normalized film thickness should be within a range of about 0.6d+0.85 to about 0.6d+1.30 to make the ripples in the band caused by the transversal mode wave to be about 1.5 dB or less, and should be within a range of about 0.6d+1.00 to about 0.6d+1.23 to make the ripples in the band caused by the transversal mode wave to be about 0.5 dB or less.

Figure 9:
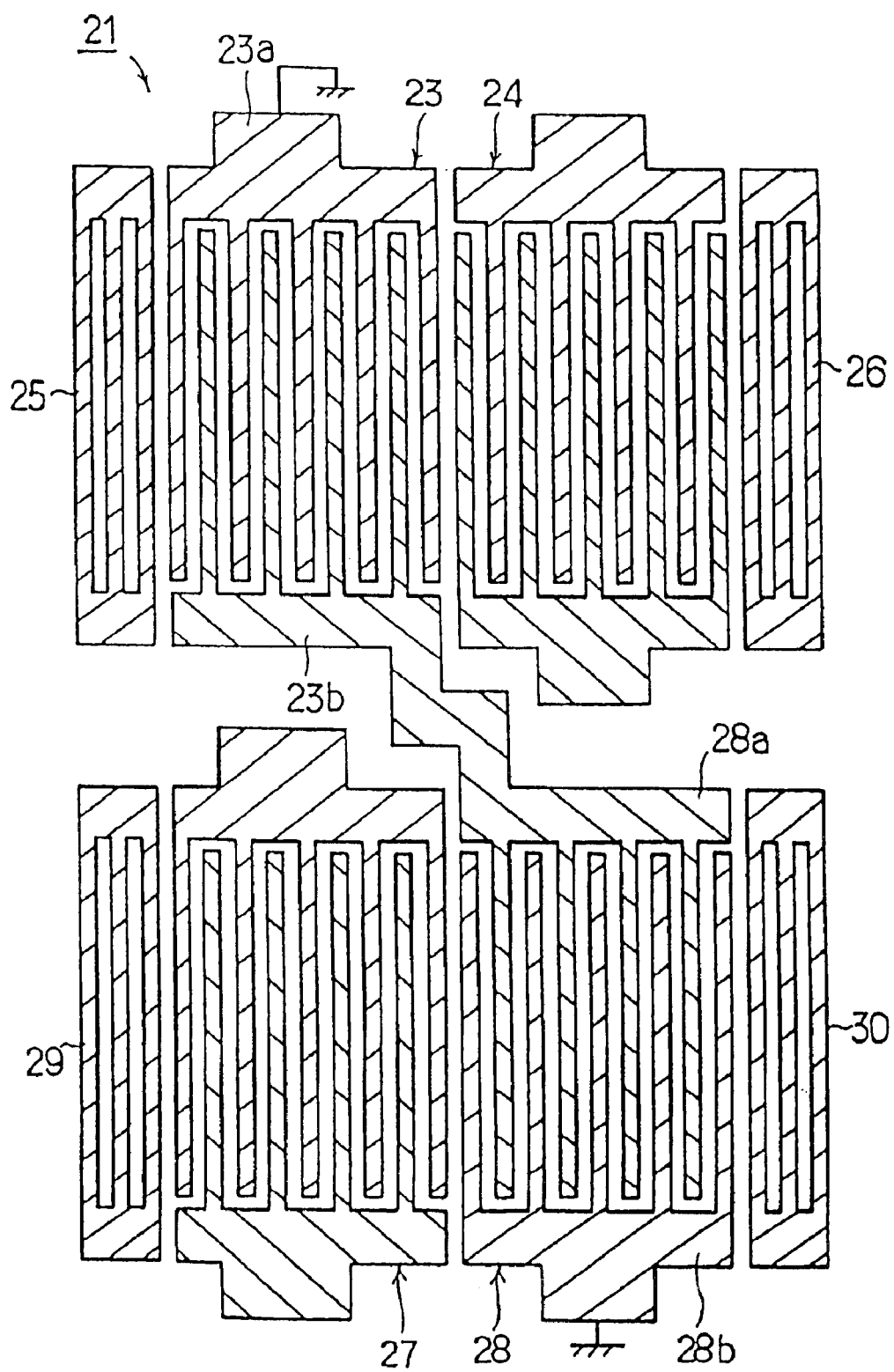
FIG. 9 is an outline plan view showing a modification of the surface acoustic wave device according to a preferred embodiment of the present invention.

In the foregoing preferred embodiments of the present invention, a one-stage longitudinally coupled resonator-type surface acoustic wave filter has been described. Two longitudinally coupled resonator-type surface acoustic wave filters may be connected in a cascade arrangement to define a surface acoustic wave device 21 shown in FIG. 9. In this case, a first-stage longitudinally coupled resonator-type surface acoustic wave filter includes IDTs 23 and 24 and reflectors 25 and 26, and a second-stage longitudinally coupled resonator-type surface acoustic wave filter includes IDTs 27 and 28 and reflectors 29 and 30. The first-stage and second-stage longitudinally coupled resonator-type surface acoustic wave filters preferably have the same structure as the longitudinally coupled resonator-type surface acoustic wave filter shown in FIG. 1. Among the comb electrodes 23a and 23b of the IDT 23 of the first longitudinally coupled resonator-type surface acoustic wave filter, one comb electrode 23b is electrically connected to one comb electrode 28a among the comb electrodes 28a and 28b of the IDT 28 of the second-stage longitudinally coupled resonator-type surface acoustic wave filter.

Also in the surface acoustic wave device 21, when the IDTs 23, 24, 27, and 28 are constructed in the same way as in the above-described preferred embodiment, ripples caused by a transversal mode wave are effectively minimized and eliminated.

Figure 10:
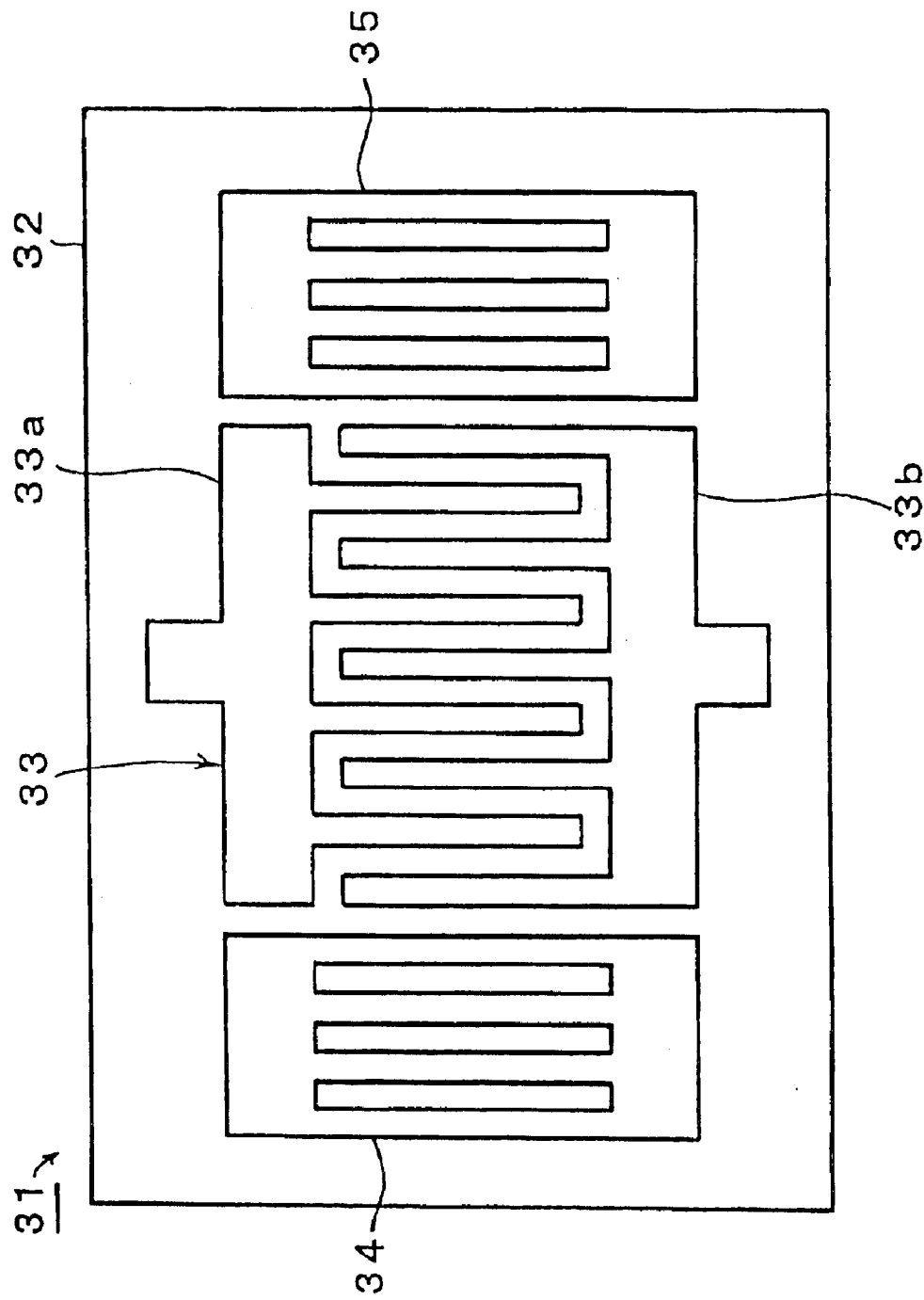
FIG. 10 is a circuit diagram showing a ladder-type circuit defining a filter circuit including a surface acoustic wave device according to a preferred embodiment of the present invention.

A surface acoustic wave device according to the present invention is not limited to the above-described longitudinally coupled resonator-type surface acoustic wave filters. Specifically, also in a one-port surface acoustic wave resonator 31 shown in FIG. 10, when an IDT 33 disposed on a quartz substrate 32 is constructed in the same way as the IDTs 13 and 14 described in the foregoing preferred embodiment, ripples caused by a transversal mode wave are suppressed. In FIG. 10, there are also shown comb electrodes 33a and 33b and reflectors 34 and 35.

Figure 11:
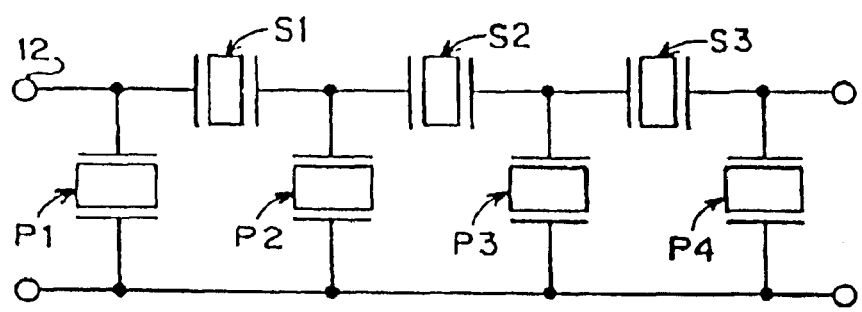
FIG. 11 is an outline block diagram showing a transmitter and receiver in which a surface acoustic wave device according to a preferred embodiment of the present invention is used.

In addition, the present invention can also be applied to various surface acoustic wave filters in which a plurality of the one-port surface acoustic wave resonators is disposed and the plurality of the surface acoustic wave resonator is electrically connected to define filter circuits. As shown in FIG. 11, for example, a plurality of one-port SAW resonators may be connected on a quartz substrate so as to define a ladder-type filter having a plurality of series resonators S1 to S3 and a plurality of parallel resonators P1 to P4. In the same way, a plurality of one-port surface acoustic wave resonators may be connected to define a lattice-type circuit.

In the foregoing preferred embodiment, the IDTs 13 and 14 are preferably made of Ta. In the present invention, an IDT may be made from a metal having a larger mass than that of aluminum. An IDT is not necessarily made from a single metal material. Unless the entire IDT has a smaller mass than an IDT made from aluminum, it may have a structure in which a plurality of electrode layers are laminated to define the IDT. In this case, at least one electrode layer should be made from a metal or an alloy having a larger mass than that of aluminum.

The present invention can also be applied to various surface acoustic wave devices, such as surface acoustic wave resonators and surface acoustic wave filters. When the present invention is applied to a surface acoustic wave filter, for example, it can function as a band filter of a mobile transmitter and receiver.

Figure 12:
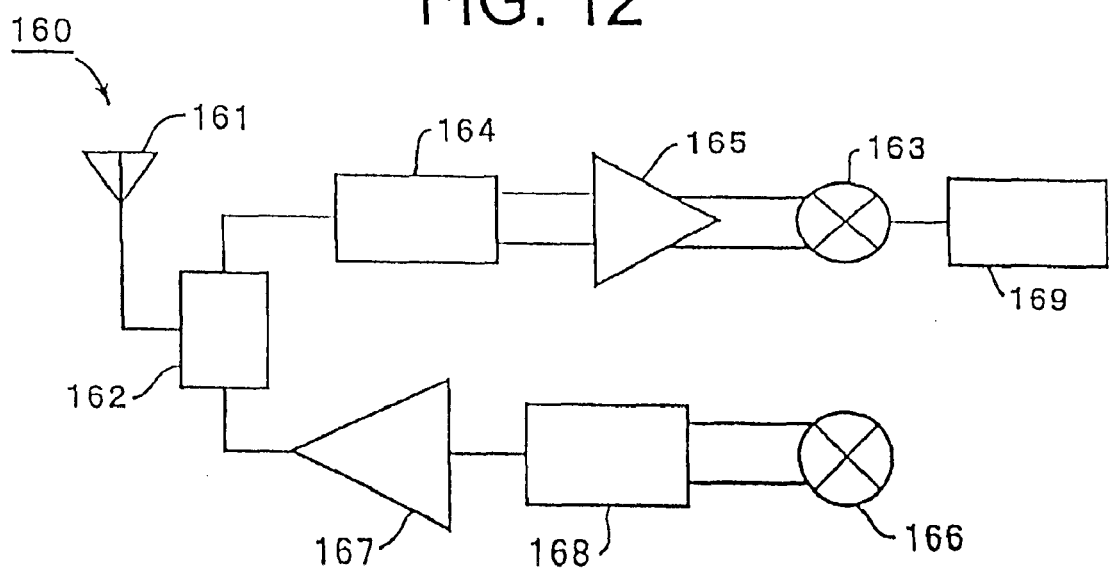
FIG. 12 is an outline block diagram showing another transmitter and receiver in which a surface acoustic wave device according to a preferred embodiment of the present invention is used.
Figure 13:
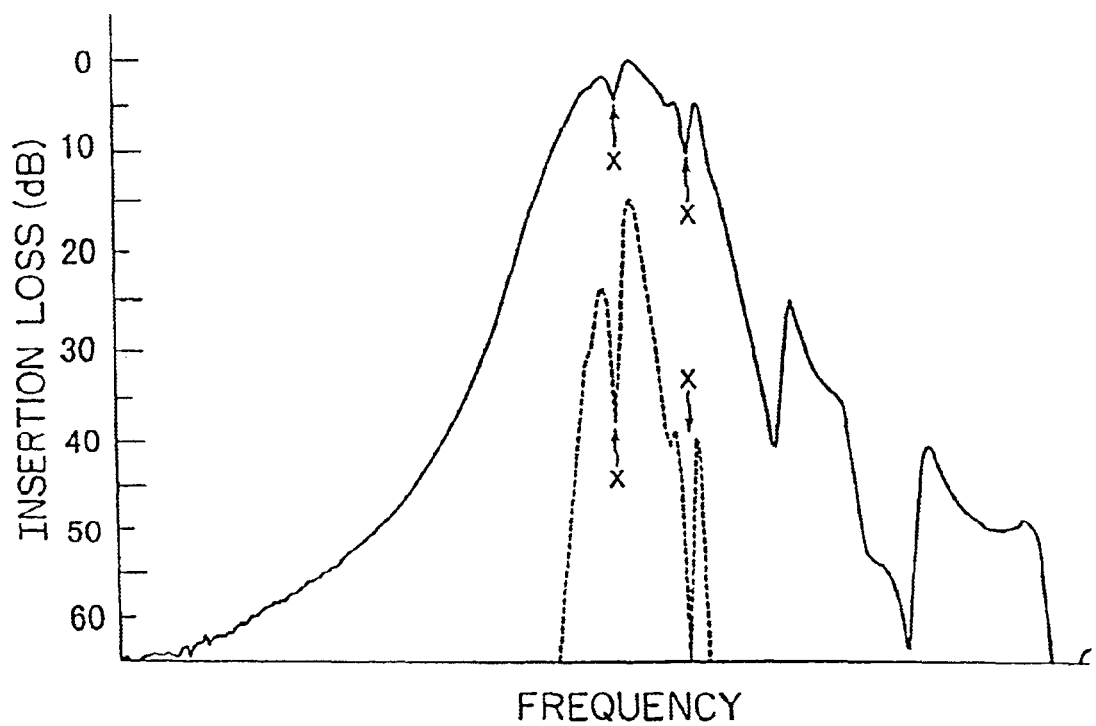
FIG. 13 is a view showing an attenuation-frequency characteristic used for describing a problem with a conventional surface acoustic wave device.

In FIG. 12, an antenna 161 is connected to a duplexer 162. Between the duplexer 162 and a receiving-side mixer 163, a surface acoustic wave filter 164 and an amplifier 165 are connected, which constitute an RF stage. An IF-stage surface acoustic wave filter 169 is connected to the mixer 163. Between the duplexer 162 and a transmitting-side mixer 166, an amplifier 167 and a surface acoustic wave filter 168 are connected, which constitute an RF stage.

A surface acoustic wave device according to various preferred embodiments of the present invention can be successfully used as the surface acoustic wave filter 169 in the above transmitting and receiving machine 160.

In a surface acoustic wave device of a preferred embodiment of the present invention, at least one IDT including an electrode structure having a larger mass effect than that of Al is disposed on a quartz substrate, and the IDT metallization ratio "d" and the normalized film thickness h/λ are within specific ranges such that ripple caused by a transversal mode wave is about 0.5 dB or less. In this case, to form an IDT that satisfies the desired normalized film thickness h/λ, a method is suitably used in which a metal film is formed on a quartz substrate, and reactive ion etching or a lift-off process is used to perform patterning to form at least one IDT. To form an IDT made from a material having aluminum as a main component, patterning is widely performed by wet etching conventionally. Wet etching is not suited to very fine machining, and it is impossible to use wet etching to form an IDT having a line width satisfying the above-described specific desired normalized film thickness h/λ. Electrode fingers having a line width satisfying the desired normalized film thickness h/λ can be formed with high precision by using a patterning method including reactive ion etching or a lift-off process.

In a surface acoustic wave device according to a preferred embodiment of the present invention, when it is necessary to polish a quartz substrate to adjust a frequency, or when an electrode layer is formed under an electrode layer made from a metal, such as Ta, having a large mass, the film thickness of an IDT should be set to an equivalent value to the above-described desired normalized film thickness h/λ, with an effect caused by the polishing of the quartz substrate on a mass load caused by the electrode layer having a larger mass than that of aluminum, or the mass-load operation of the electrode layer disposed under being taken into account comprehensively. With that setting, ripples caused by a transversal mode wave are effectively minimized and eliminated in the same way as in the preferred embodiments described above.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a surface acoustic wave device using a Shear Horizontal type surface acoustic wave, comprising the steps of:

preparing a quartz substrate;

forming a metal film having a larger mass-load effect than that of aluminum on the quartz substrate; and patterning the metal film to form at least one interdigital transducer by one of reactive ion etching and a lift-off process such that a metallization ratio "d" and a normalized film thickness h/λ of the at least one interdigital transducer which makes a spurious transversal mode ripple to be about 1.5 dB or less are satisfied, where "d" is the metallization ratio of the interdigital transducer, "λ" is the wavelength of a surface acoustic wave, and "h" is the film thickness of the interdigital transducer.

2. A method according to claim 1, wherein the metal film is made from tantalum, and patterning is performed such that the normalized film thickness h/λ is within a range of about 0.6d+1.50 to about 0.65d+1.87 to form the at least one interdigital transducer.

3. A method according to claim 2, wherein patterning is performed such that the normalized film thickness h/λ of the at least one interdigital transducer is within a range of about 0.6d+1.65 to about 0.6d+1.81.

4. A method according to claim 1, wherein the metal film is made from tungsten, and patterning is performed such that the normalized film thickness h/λ is within a range from about 0.6d+0.85 to about 0.6d+1.30 to form the at least one interdigital transducer.

5. A method according to claim 4, wherein patterning is performed such that the normalized film thickness h/λ of the interdigital transducer is within a range from about 0.6d+1.00 to about 0.6d+1.23.

* * * * *